United States Patent [19]

Helmer

[11] Patent Number: 4,629,548
[45] Date of Patent: Dec. 16, 1986

[54] PLANAR PENNING MAGNETRON SPUTTERING DEVICE

[75] Inventor: John C. Helmer, Menlo Park, Calif.

[73] Assignee: Varian Associates, Inc., Palo Alto, Calif.

[21] Appl. No.: 719,182

[22] Filed: Apr. 3, 1985

[51] Int. Cl.⁴ ............................................. C23C 15/00
[52] U.S. Cl. ................................... 204/298; 204/192.2
[58] Field of Search ............................ 204/298, 192 M

[56] References Cited

U.S. PATENT DOCUMENTS

| | | | |
|---|---|---|---|
| 2,146,025 | 2/1939 | Penning | 250/27.5 |
| 3,117,065 | 1/1964 | Wootten | 204/192 M |
| 3,353,054 | 11/1967 | Holland | 313/178 |
| 3,412,310 | 11/1968 | Quinn | 321/15 |
| 3,447,072 | 5/1969 | Sheldon | 324/33 |
| 3,566,185 | 2/1971 | Gavin | 315/111 |
| 3,898,496 | 8/1975 | Hudson et al. | 313/62 |
| 4,282,083 | 8/1981 | Kertesz et al. | 204/298 |
| 4,324,631 | 4/1982 | Meckel et al. | 204/192 M |
| 4,344,019 | 8/1982 | Gavin et al. | 315/111.81 |
| 4,391,697 | 7/1983 | Morisson | 204/298 |
| 4,401,546 | 8/1983 | Nakamura et al. | 204/298 |
| 4,412,907 | 11/1983 | Ito et al. | 204/298 |
| 4,414,087 | 11/1983 | Meckel | 204/298 |
| 4,431,505 | 2/1984 | Morrison | 204/298 |
| 4,448,653 | 5/1984 | Wegmann | 204/298 |
| 4,500,409 | 2/1985 | Boys et al. | 204/192 R |
| 4,564,435 | 1/1986 | Wickersham | 204/192 R |
| 4,576,700 | 3/1986 | Kadokura | 204/298 |

OTHER PUBLICATIONS

"Magnetron Sputtering Sources for Ferromagnetic Material", J. Vac. Sci. Technol. A 3(1), Jan./Feb. 1985, pp. 10-13-B. Window and F. Sharples.

Primary Examiner—Arthur P. Demers
Attorney, Agent, or Firm—Terrance Dooher; Stanley Z. Cole

[57] ABSTRACT

An improved magnetron sputter source particularly suitable for magnetic materials is provided in the forming of an unfolded Penning discharge source. The two cathodes are in the form of an inner cathode roughly coplanar with an outer cathode ring. An anode radially between the cathodes is raised above the cathode surfaces so as to block line of sight from the inner cathode surface to the outer. A magnetic flux vector is imposed which passed from one cathode surface to the other. Raising the anode surface about one-fourth inch above the cathode surfaces allows raising the applied voltage so that a source of 5 kilowatts or greater is possible. Raising the anode also spreads the distribution of discharge more uniformly over the target surface and permits low pressure operation thereby facilitating good adhesion and uniform coverage of the substrate.

6 Claims, 5 Drawing Figures

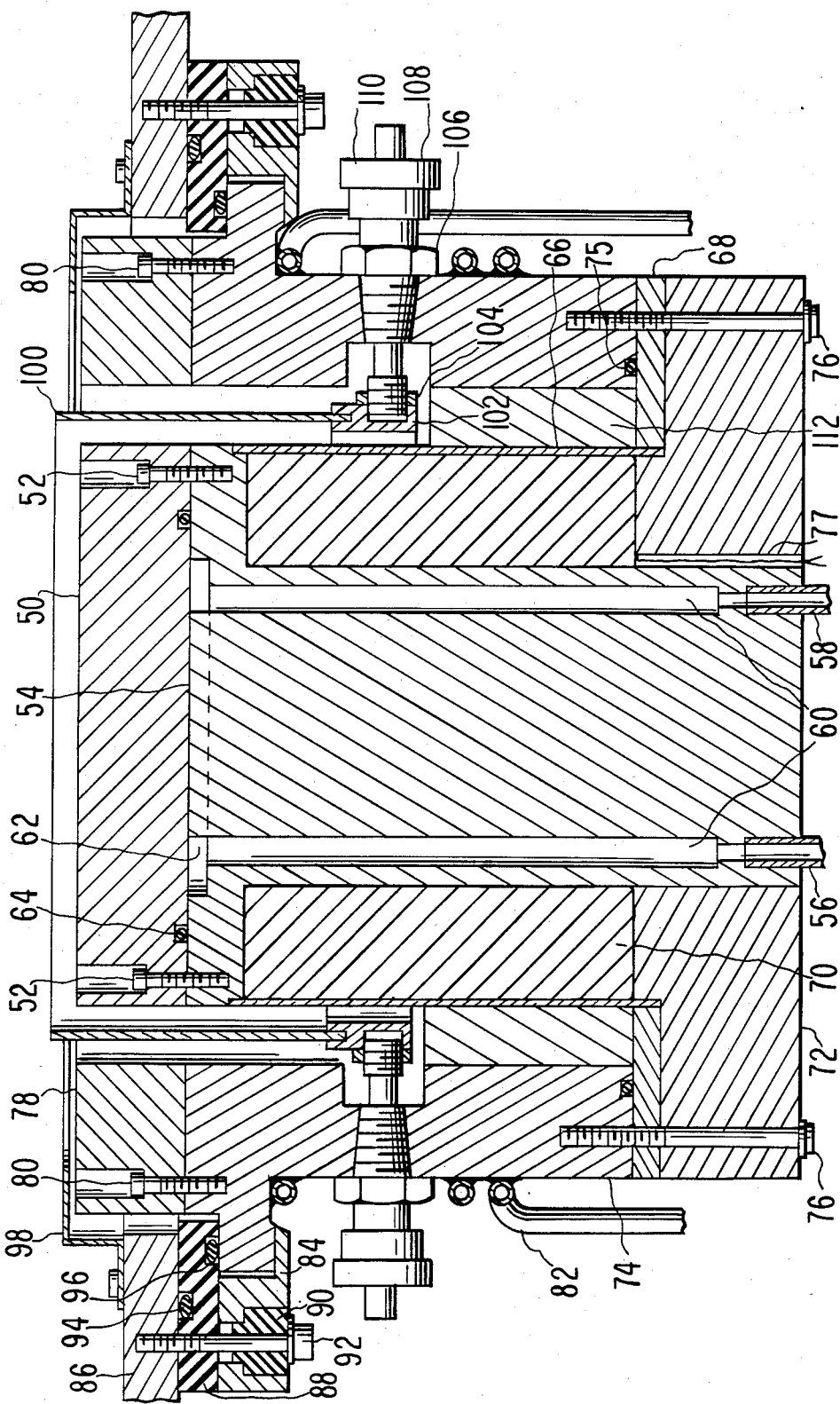

PLANAR PENNING MAGNETRON SPUTTERING DEVICE

FIELD OF THE INVENTION

This invention is in the field of vacuum coating apparatus and particularly relates to coating with magnetic materials using an improved magnetron sputter coating source.

BACKGROUND OF THE INVENTION

Vacuum deposition of coatings using cathode sputtering induced by glow discharges is currently in widespread use. Sputter coating sources include cathode and anode structures, and are operated in an evacuated chamber backfilled with a sputter gas (typically argon at subatmospheric pressure). Positive ions formed in the space between anode and cathode impact a target located on the cathode surface, ejecting (by sputtering) atoms of target material from the surface and near subsurface atomic layers of the target. These sputtered atoms deposit on workpieces or substrates placed generally in line of sight of the target. Magnetron sputter coating sources employ magnetic fields crossed with electric fields in the vicinity of the target. The use of such magnetic fields can enhance glow discharge intensities and the attendant sputtering rates, extend operation to lower sputter gas pressures, confine the glow discharge to the neighborhood of the electrodes, and reduce electron bombardment of the substrates.

One type of magnetron sputter coating source in commercial use employs a nonmagnetic annular sputter target (cathode) of a generally inverted conical configuration surrounding an axially symmetric central anode. One example of such a sputter coating source may be found described in U.S. Pat. No. 4,100,055, issued July 11, 1978 to Robert M. Rainey and entitled "Target Profile for Sputtering Apparatus" and assigned to the assignee of the present invention. Magnetron sputter coating sources of the type just mentioned have been used extensively and effectively in important semiconductor wafer coating applications. In most cases, the materials being deposited are nonmagnetic, such as aluminum and its alloys, etc. In some cases, however, it has been desired to use the same sputter coating source to dispense such magnetic materials as iron, nickel, iron-nickel-alloys, etc., as well as the nonmagnetic materials for which the sputter coating source was initially designed. More recently, a need has emerged for coating magnetic disk substrates with multiple layers, at least one of which is of magnetic material. Magnetic disks are now vitally important in computer memory applications.

Simply replacing a nonmagnetic sputter target with a magnetic one of the same generally inverted conical configuration in the magnetron sputter coating source referred to above causes most of the magnetic field to be shunted through the magnetic target. This results in magnetic field intensities above the target which are too low to allow the desired magnetic enhancement of the glow discharge to take place.

In order to avoid excessive reduction in magnetic field intensities above the target, annular magnetic sputter targets of a generally L-shaped profile have been developed for use in the above-described sputter coating source. One such L-shaped magnetic sputter target is described in U.S. Pat. No. 4,060,470, issued Nov. 29, 1977 to Peter J. Clarke and entitled "Sputtering Apparatus and Method". An essential feature of the L-shaped design is that the radial thickness of the outer annular band portion must be sufficiently thin that it is magnetically saturated in order that the magnetic field intensities above the target can be made sufficiently great that the desired magnetic enhancement of the glow discharge takes place. The higher the magnetic permeability and the saturation magnetization of the material, the thinner the annular band portion must be.

Magnetic sputter targets having an L-shaped profile contain much less material than nonmagnetic sputter targets of a generally inverted conical configuration. Moreover, the magnetic fields above the L-shaped magnetic targets lead to target erosion which is concentrated in the corner region. In relative terms, the inventory of magnetic target material usefully available for sputtering is therefore very limited.

It is also known that a magnetic material heated to or above its Curie temperature loses its ferromagnetism while so heated. Another approach to avoiding excessive reduction in magnetic field intensities above the sputter target, therefore, is to heat the target and maintain it at or above its Curie temperature. A disadvantage of this approach is that it requires means for monitoring the temperature of the target, coupled with a feedback system for achieving and maintaining the required Curie temperature. Also, the Curie temperature of some magnetic materials is so high as to be detrimental to the adjacent substrate being coated and/or to the vacuum seals for the system and/or to cause damage to the sputter coating source or target as a result of warping or excessive thermal expansion.

Most present-day magnetron sputter coating sources employ permanent magnets to provide the magnetic field required for glow discharge enhancement. As the sputter target erodes, the magnetic field intensities above the sputter target generally become stronger, leading to a lower electrical impedance of the glow discharge. This causes the sustainable voltage across the glow discharge to fall, bringing with it a decrease in sputtering yield. Maintaining a fixed sputtering rate, and hence a fixed coating rate, at a desired sputter gas pressure requires both higher current and a higher power. The glow discharge power supply must therefore be capable of providing extended ranges of voltage, current, and power, which adversely affects both power supply and power consumption costs.

Additional factors affect the electrical impedance of glow discharges. Sputter gas pressure is one. Others include thermal effects (expansion, contraction, and Curie-temperature-related) in sputter targets and magnetic circuits. The permanent magnet means used in most present-day magnetron sputter coating sources do not provide compensation of glow discharge impedance changes arising from such factors.

It is a well-known characteristic of glow discharges that the conditions for ignition (discharge initiation) and steady state operation are different. In some cases it is desirable to operate at a sputter gas pressure so low that ignition cannot occur with the magnetic fields in the sputter source (as provided by the usual permanent magnets) and the open-circuit voltage of the glow discharge power supply. One technique that can be used is to raise the sputter gas pressure sufficiently to allow ignition to occur, and then to reduce the sputter gas pressure to the desired operating level. Disadvantages of this approach include the relatively long time constants associated with the required pressure changes, plus the costs and complexity associated with controlling sufficiently quickly (that is, in times short in comparison with a coating cycle) the sputter gas pressure, which is normally controlled by flow rate and pumping speed.

Magnetic saturation of the cathode is the approach taken in the sputtering source described in U.S. Pat. No. 4,500,409 to Donald L. Boys et al issued Feb. 19, 1985, entilted "Magnetron Sputter Coating Source for Both Magnetic and Nonmagnetic Target Materials" and assigned to the assignee of the present invention. The magnetic field is provided by an electromagnetic coil and may be varied over a wide range of values. The coil surrounds an inner cylinder. A base plate connects the inner cylinder with an outer cylinder to form a magnetic yoke. A radial gap is provided between the inner and outer cylinders. The sputter target is positioned atop this gap. The yoke and the polepieces are made of ferromagnetic materials having high magnetic permeabilities and high saturation magnetizations, such as soft iron or a magnetic stainless steel. The base plate and cylinders have sufficiently large cross-sectional areas transverse to the direction of the internal magnetic flux lines that a very low reluctance (low magnetic resistance) path to the polepieces is provided at the maximum electromagnet coil current (to produce maximum magnetomotive force) required during operation.

When a sputter target of magnetic material is positioned atop the polepiece gap, it acts as a magnetic shunt at sufficiently low coil currents, whereby the magnetic field intensities adjacent the target are negligibly small. Upon increasing the coil current sufficiently, the onset of magnetic saturation of a portion of the target will occur. For a ring-shaped magnetic target of uniform thickness, this initial saturation will take place at a radius slightly greater than that of the inner polepieces, and fringing magnetic field lines will be established above and below the target near this radius. As the coil current is increased further, the magnetically saturated region will increase in radial extent, forming a high reluctance magnetic gap across which fringing magnetic field lines of increased intensity will be established. Unsaturated portions of the target will extend axially above the polepieces, and also radially inward and outward of the above-mentioned magnetic gap, thereby forming axial and radial extensions of the polepieces. At a particular required value of coil current, the configuration and intensities of magnetic fields above the target will permit the desired enhancement of the glow discharge to be achieved. This required value will increase with the magnetic permeability and the saturation magnetization of the target material, and also with target thickness. This source requires the thickness of the cathode be kept sufficiently thin to allow saturation and fringing. Power is limited by the low voltage and high currents needed to operate.

Concepts of the planar magnetron discharge closely parallel the common, magnetic-field free glow discharge between opposing electrodes at a pressure of one torr. Adjacent to the cathode, there is a cathode dark space, then a negative glow and then a positive column. The negative glow is an intense, ring-shaped discharge anchored to the cathode of the planar magnetron. An essential difference between the operation of the glow discharge sputtering source with or without a magnet is that the magnetic field allows for discharge to operate at a pressure of a few millitorr with minimal scattering and dissipation of the sputtered atoms by background gas.

In the deposition of magnetic materials, operation of the planar magnetron presents special problems. In the intense region of the discharge, the magnetic field is parallel to the surface of the cathode. Thus, if the cathode is a thick piece of magnetic material, the field may be shunted and the discharge will not operate. In two solutions to this problem, the cathode is driven beyond magnetic saturation or is slotted.

If a cylindrical shell anode is placed between two opposed cathodes and a magnetic field is imposed normal to the cathodes, the problem of shunting of the magnetic field is eliminated. The discharge is known as a Penning discharge. The enclosed geometry of the Penning structure is not suitable for thin film deposition on a planar substrate.

OBJECTS OF THE INVENTION

Accordingly, it is an object of the invention to provide a magnetron sputter coating source which can utilize efficiently a large inventory of magnetic sputter target material.

It is also an object of the invention to provide a magnetron sputter source having thick targets.

It is yet another object of the invention to provide a magnetron sputter source operating at higher voltages to deliver higher sputtering power.

It is a further object of the invention to provide a magnetron sputter coating source which can utilize efficiently a large inventory of sputter target material, independent of magnetic permeability and saturation magnetization of the target material.

It is also an object of the invention to provide a magnetron sputter coating source in which the sputter target configuration can be independent of magnetic permeability and saturation magnetization of the target material.

It is another object of the invention to provide a magnetron sputter coating source in which a magnetic sputter target may be usefully operated at a temperature below the Curie temperature of the magnetic target material.

It is a further object of the invention to provide a magnetron sputter coating source in which a means is provided for controlling the electrical impedance of the glow discharge in the face of changes which may occur due to sputter target erosion.

It is yet another object of the invention to provide a magnetron sputter coating source in which a means is provided for controlling the electrical impedance of the glow discharge in the face of sputter target temperature changes.

It is a still further object of the invention to provide a magnetron sputter coating source in which a means is provided for controlling the electrical impedance of the glow discharge in the face of magnetic circuit changes.

It is another object of the invention to provide a magnetron sputter coating source in which a means is provided for controlling the electrical impedance of the glow discharge in the face of sputter gas pressure changes.

It is an additional object of the invention to provide a magnetron sputter coating source in which a means is provided for effecting glow discharge ignition at a desired steady-state sputter gas operating pressure.

A further object of the invention is to provide a magnetron sputter coating source having a means for controlling the distribution pattern of sputtered material arriving at the substrate being coated, with such control being provided throughout the useful life of the sputter target.

A still further object of the invention is to provide a magnetron sputter coating source in which a means is provided for increasing the useful life the sputter target.

Additional objects and features will become apparent from the ensuing description of the invention.

BRIEF DESCRIPTION OF THE INVENTION

The Penning cell is unfolded into a planar geometry suitable for thin film deposition at millitorr pressures. In the planar Penning magnetron the cathodes are a central disk-shaped cathode, an outer annular cathode and an intermediate annular anode. The magnetic field is generated by a coil around the cylindrical axis of symmetry. The anode forms a septum between the cathodes. Where the magnetic field intersects the anode, no discharge can form, and the height of the anode extension above the cathode plane is an important parameter. The discharge is constrained to a glow which passes over the anode. Visually the discharge appears as a diffuse glow funneling down to the edge of the anode where it is anchored, in contrast to the planar magnetron in which the discharge is anchored to the cathode.

These and further constructional and operational characteristics of the invention will be more evident from the detailed description given hereinafter with reference to the figures of the accompanying drawings which illustrate preferred embodiments and alternatives by way of non-limiting examples.

BRIEF DESCRIPTION OF THE DRAWINGS

FIG. 4 shows a sectional drawing of the preferred embodiment of the invention.

DESCRIPTION OF THE PREFERRED EMBODIMENTS

Figure 1:
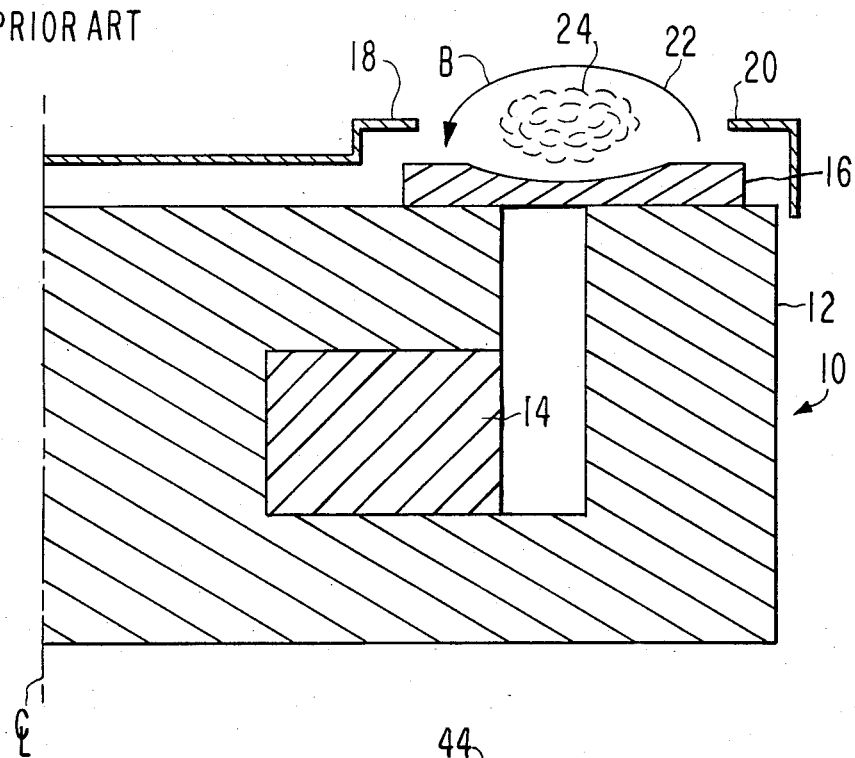
FIG. 1 shows a cross-section through a planar magnetron device of the prior art.

Referring now to the drawings wherein reference numerals are used to designate parts throughout the various figures thereof, there is shown in FIG. 1 a schematic of a section of a sputtering device for magnetic materials typical of the prior art as in U.S. Pat. No. 4,500,409 to Boys et al, commonly assigned with this patent. The sputtering device 10 consists of a yoke 12 of magnetic material, an electromagnetic coil 14, a cathode 16 of magnetic material, an inner anode 18 and an outer anode 20. The cathode is driven past magnetic saturation so that a fringing flux 22 passes through the region above the cathode. The discharge 24 appears anchored to the cathode.

Figure 2:
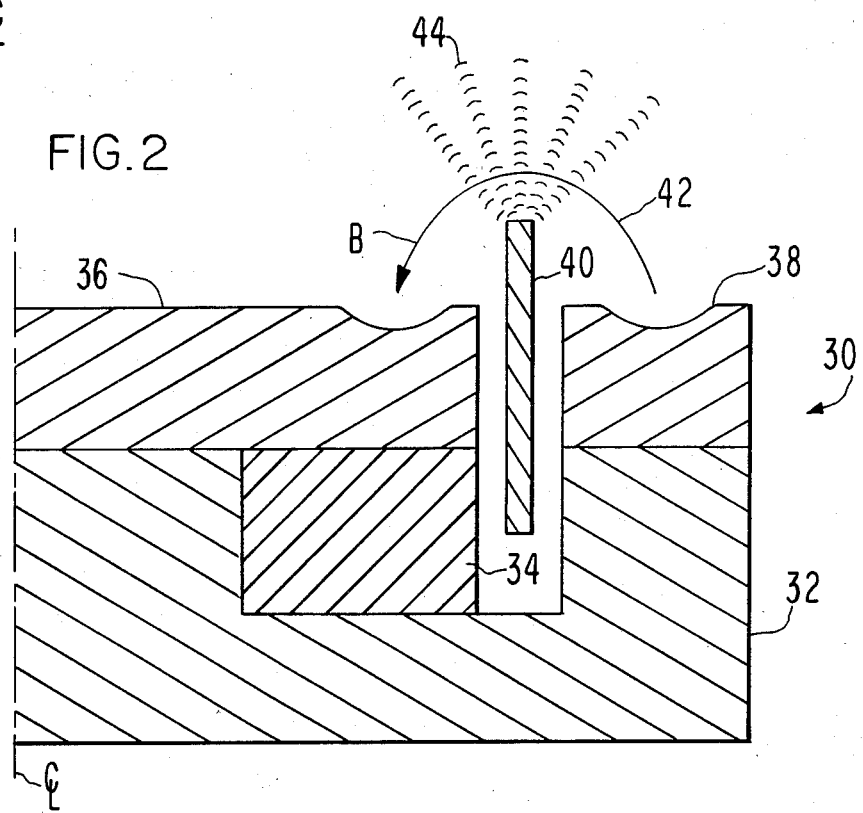
FIG. 2 shows a cross-section through a planar Penning magnetron device according to the invention.

According to the invention, the planar Penning magnetron (PPM) device 30 is shown in FIG. 2 in a schematic section in contrast to the planar magnetron of the prior art. The PPM device 30 consists of a yoke 32 of magnetic material, an electromagnetic coil 34, an inner cathode 36 of magnetic material, an outer cathode 38 of magnetic material, and an anode 40 intermediate between the inner cathode 36 and outer cathode 38. A magnetic fringing flux 42 passes through the region above the anode 40 and cathodes 36 and 38. The discharge 44 appears to be radiating from the anode. The height top of the anode 40 above the top surfaces of the cathodes 36 and 38 is an important parameter in the operation of the PPM device as will be described further hereinafter.

Figure 3:
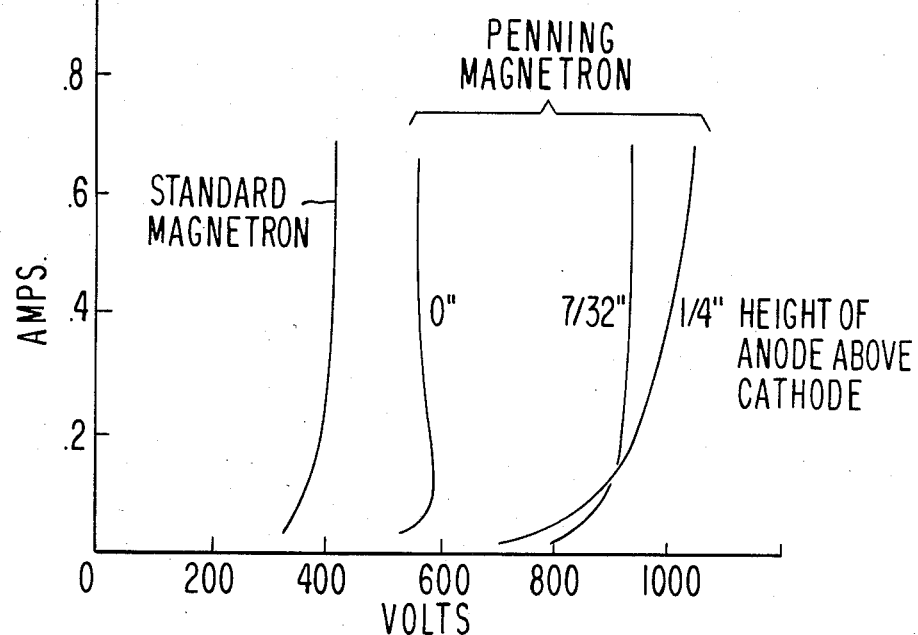
FIG. 3 shows plots of voltage versus current for a magnetron source of the prior art and the planar Penning magnetron according to the invention for various elevations of the anode over the cathodes.

A series of low power PPM designs were investigated, in which the geometry was varied, including the construction of concentric anode rings. With a flush anode the sputtering was concentrated on the adjacent corners of the cathodes. To spread the sputtering pattern over the cathode surface the anode was raised above the cathode plane. This had the desired result of producing grooves of erosion in the cathode surfaces, as illustrated in FIG. 2. The anode height also controls the operating voltage of the discharge. As the height increases, the voltage increases, and it is possible to operate as high as a thousand volts. The influence of the PPM anode height on the current-voltage characteristic, in comparison with this characteristic in a planar magnetron, is shown in FIG. 3. Clearly, the PPM has a glow characteristic similar to the planar magnetron, in which at high currents the voltage is almost independent of current. At low currents there is a knee in the curve whose shape reflects the amplification of kinetic processes in the plasma.

Magnetic field strength is a variable affecting the operating voltage and the lower pressure limits of the glow. As the B field decreases the operating voltage increases. Likewise, as the pressure decreases the operating voltage increases. It fits that the low pressure limit of the glow may be extended by increasing the magnetic field.

This is a matter of some importance. Gas scattering at five millitorr, a common operating pressure, reduces the deposition rate and the energy of the impact of sputter atoms. To reduce such effects the pressure of operation should be one millitorr. In most planar magnetrons the glow tends to extinguish at this pressure. Likewise, it is felt that high pressure scattering is needed to promote step coverage, at the sacrifice of deposition rate and throughput. However, it is now found nearly isotropic deposition can be achieved with a double ring sputtering design in high vacuum, with an unusually high deposition efficiency of 32% onto a wafer substrate. Beyond this, gas scattering will not improve step coverage as long as the mean-free path is larger than the feature size. Thus, optimization of sputtering for thin film deposition is achieved by operating at pressures below one millitorr.

Both the PPM and the planar magnetron have a mode change in which the glow is replaced by a high voltage discharge [where current is proportional to pressure] as pressure decreases towards one millitorr. The factors which influence this change have not been studied. Magnetic field strength may be the most important variable.

A high power PPM was designed for use with a 5 Kw switching power supply. A cross section according to the invention is shown in FIG. 4. Water cooled iron pole pieces were used as cathodes. The electromagnetic coil could provide a magnetic field of up to 1.3 kilogauss at the edge of the anode, which was raised one-fourth inch above the plane of the cathodes. The 5.5 inch diameter anode was made of thin stainless steel and supported from a cooling ring deep in the magnet gap. The open circuit voltage of the switching power supply was 1023 volts.

A centrally located first cathode 50 is attached by bolts 52 to a water cooled central core 54 of magnetic material, such as type 430 stainless steel. Cooling lines 56 and 58 are welded into the central core 54 at cooling channels 60. The cooling channels 60 connect to a cooling ring 62 and an O-ring 64 is used to separate the water channels from the internal vacuum of the sputter source. A coil retaining wall 66 of non-magnetic material, such as type 304 stainless steel, is welded to an inner yoke piece 68 of magnetic material, such as type 430 stainless steel, and to the central core 54. The electromagnetic coil 70 is inserted behind the retaining wall 66. A back yoke ring 72 and side yoke ring 74 are fastened together with bolts 76 through the inner yoke piece 68. An O-ring 75 is provided for sealing between inner yoke piece 68 and side yoke ring 74. A hole 77 is provided in back yoke ring 72 for coil leads. A second cathode 78 is fastened with bolts 80 to the side yoke piece 74. A spacer 112 of aluminum or other nonmagnetic material is inserted below the anode support ring 102 with a gap of about an eight-inch to inhibit the discharge in this region. Cooling coils 82 are brazed to the outside of the side yoke piece 74. Outer yoke pieces 84 and 86 together with insulating ring 88, insulators 90, bolts 92 and O-rings 94 and 96 are used to space and support an outer anode ring 98. Anode 100 is attached to an anode support ring 102 which is hollow to circulate cooling water. Connector 104, stuffing gland 106 and insulated bushing 108 are used to connect a cooling water tube 110 to the anode support ring 102.

Figure 5:
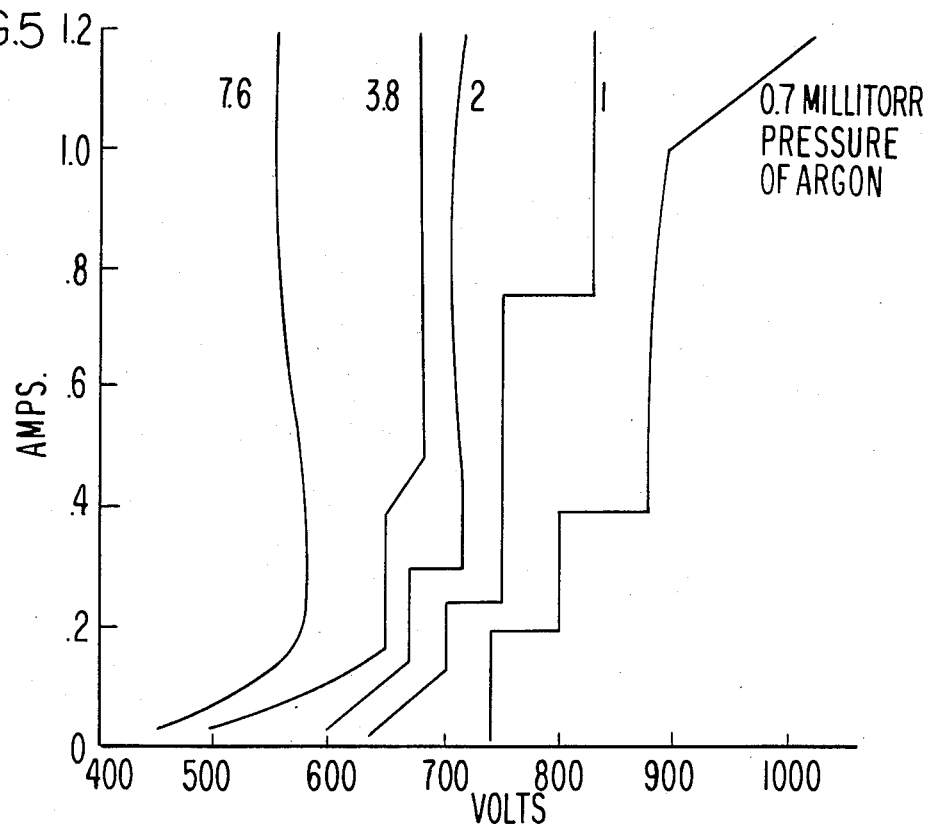
FIG. 5 shows plots of current versus voltage for various pressures of Argon according to the invention.

Current-voltage characteristics at a magnetic field of 1.0 kilogauss, are shown at FIG. 5 at various pressures down to 0.7 millitorr of Argon. While the glow character is retained throughout, the low pressure curves show several discontinuous voltage steps on the order of 75 volts in size. Similar curves are obtained with different magnetic fields, except with increasing magnetic field the group as a whole is moved to lower pressure.

In this device the outer shield acts as an auxiliary anode helping to spread the discharge over the surface of the outer cathode. The center of the inner cathode is not sputtered, and the erosion pattern here could be extended in another embodiment by mounting an auxiliary anode in the center region.

Glow discharge impedance control is of particular importance because it can allow, for example, operation at a constant discharge voltage over a wide range of discharge currents. With sputter target erosion during normal operation, the magnetic field becomes weaker in the region of the anode of the glow discharge, which increases the discharge impedance and voltage for a fixed sputter gas pressure. The higher discharge voltage leads to increased sputter yield from the target. To maintain a fixed coating deposition rate, it is necessary to reduce both the current and the power in the discharge. Increasing the electromagnet coil current allows the magnetic field intensities to be increased, bringing a return to the original discharge impedance and voltage. Electrical control of the magnetic field can, for example, maintain discharge voltage and current constant over the life of the sputter target. This has important implications to the design and construction of the glow discharge power supplies because the power supplies no longer have to provide a wide range of output voltage.

When a sputter target erodes and the magnetic field becomes weaker in the region of the glow discharge, the discharge tends to become less concentrated, thereby producing a relatively wider groove as erosion proceeds. This leads changes in the distribution pattern of sputtered material, and to an increased inventory of usable sputter target material (therefore increased life). This effect is also stabilized by increasing magnetic field intensities through electromagnet coil current control.

The radial position and the widths of the sputter target erosion pattern, and hence the distribution pattern of sputtered material, are influenced by the magnetic field intensities above the sputter surface. Electrical control of these magnetic field intensities therefore allows a measure of control to be exercised over this distribution pattern.

It is known that the magnetic fields above the sputter target determine the ranges of sputter gas pressure both for ignition and for operation. In general for a given magnetic field distribution, a glow discharge will operate stably at pressures somewhat below the lowest pressure at which the discharge can be initiated. In some applications, operation at relatively low sputter gas pressures may be desirable because of reduced gas scattering of sputtered material en route from target to substrate. One method of obtaining ignition in such cases is to temporarily increase the sputter gas pressure, and then reduce it after the discharge has been initiated. With electrical control of magnetic fields available, a simpler and more convenient method of achieving ignition is to increase the electromagnet coil current momentarily while maintaining sputter gas pressure at the desired operating level.

In some applications it may be desired to convert, either temporarily or for an extended period, an existing magnetron sputter coating source to a nonmagnetic diode sputtering apparatus for a sputter-etch cleaning station. Such a conversion is readily accomplished with the disclosed embodiment of the present invention simply by reducing the electromagnet coil current to zero (after reversal to achieve demagnetization, if necessary).

To measure the sputtering rate an aluminum coated wafer was placed on axis about 6.5 inches from the iron cathodes. The wafer was masked with a strip of teflon tape. After deposition the tape was removed and the film thickness measured with an interferometer. Assuming a certain sputtering rate, it is easy to calculate the deposition on the axis from a ring source, avoiding the off-axis elliptic intervals. One can then measure the deposition rate and compute the sputtering rate. When the sputtering rate is compared with the discharge current, the atomic sputtering probability per unit charge flow should be the same as the probability per ion impact, as the cathode current may be over 95% ionic. This measurement bears on the nature of the discharge. In the planar magnetron there is a picture of a positive cathode sheath, a fraction of a millimeter thick, across which all ions gain in impact voltage equal to the voltage across the discharge.

There are many parameters of the design which can be varied simultaneously, e.g., magnetic field strength, applied voltage, height of the anode above the cathodes, size and position of outer and central auxiliary anodes, etc. The best values of the various parameters interact so there is no one single value which is optimum. It can be said, however, that a height of the anode above the cathode of about one-fourth inch allows a significant increase in the applied voltage while permitting low pressure operation. An applied power of 5 kilowatts or higher is thus possible while retaining the advantages of low pressure operation including high kinetic energy of sputtered particles and uniform deposition.

In various embodiments of the invention the central cathode and the outer cathode can have dish-shaped surfaces to optimize the distribution of the discharge over the cathode surface. The surface of the cathodes can be at slightly different elevations as long as the elevation of the highest point of the intervening anode ring blocks the line of sight from the highest points on the sputtering surfaces.

The shape of the cathodes and anode can be circular as in the drawings, elliptical, ovoid or any other shape. The cathodes can also be operated at different potentials. The circular shape in the drawings is the simplest figure to show and is not intended to be limiting. Whatever shape is used the electrodes are concentric and roughly coplanar, with minor but important relations in the heights of the electrodes as disclosed above. The magnetic flux vector must extend from the surface of one cathode into the other cathode.

This invention is not limited to the preferred embodiments heretofore described, to which variations and improvements may be made without leaving the scope of protection of the present patent, the characteristics of which are summarized in the following claims.

What is claimed is:

1. A magnetron sputter coating source comprising:
   a first cathode means supporting a first sputter target having a first outer sputter surface;
   a second cathode means supporting a second sputter target having a second outer sputter surface concentric with said first outer sputter surface;
   an anode formed as a ring concentric with said first outer sputter surface and located radially between said first outer sputter surface and said second outer sputter surface, said ring defining a circularly tangential outer plane, said circularly tangential outer plane being further outward than any point on said first or said second outer sputter surfaces; and
   means for imposing a magnetic field on said first and said second sputter targets.

2. A magnetron sputter coating source as in claim 1 wherein said first outer sputter surface and said second outer sputter surface are generally coplanar.

3. A magnetron sputter coating source as in claim 2 wherein an outermost locus of points of said anode is at least one-eighth inch above any point on either of said sputter surfaces.

4. A magnetron sputter coating source comprising:
   a first cathode means supporting a disk-shaped first sputtering target having a first planar outer sputtering surface;
   an anode shaped as a cylindrical shell positioned concentrically with said first sputtering target, one end of said cylindrical shell projecting outwardly of the plane of said first planar outer sputtering surface;
   a second cathode means supporting a ring-shaped second sputtering target having a second planar outer sputtering surface, said second planar outer sputtering surface being generally coplanar with said first planar outer sputtering surface, said second planar outer sputtering surface being concentric with said first planar outer sputtering surface;
   an electromagnet coil; and
   a yoke of magnetic material.

5. A magnetron sputter coating source comprising:
   a first cathode means supporting a first sputter target having a first outer sputter surface;
   a second cathode means supporting a second sputter target having a second outer sputter surface concentric with said first outer sputter surface;
   an anode formed as a ring concentric with said first outer sputter surface and said second outer sputter surface and located radially between said first outer sputter surface and said second outer sputter surface, said anode formed so that any line of sight between any point on said first outer sputter surface and any point on said second outer sputter surface is blocked by said anode; and
   means for imposing a magnetic field on said first and said second outer sputter surfaces.

6. A magnetron sputter source as in claim 5 where said means for imposing a magnetic field is a means for imposing a magnetic flux vector from either one of said outer sputter surfaces to the other.

* * * * *